(12) United States Patent
Sugihara

(10) Patent No.: US 8,576,190 B2
(45) Date of Patent: Nov. 5, 2013

(54) TOUCH PANEL AND DISPLAY DEVICE INCLUDING THE SAME

(75) Inventor: Yasuhiko Sugihara, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 200 days.

(21) Appl. No.: 13/124,177

(22) PCT Filed: Jun. 22, 2009

(86) PCT No.: PCT/JP2009/002834
§ 371 (c)(1),
(2), (4) Date: Apr. 14, 2011

(87) PCT Pub. No.: WO2010/058495
PCT Pub. Date: May 27, 2010

(65) Prior Publication Data
US 2011/0205183 A1 Aug. 25, 2011

(30) Foreign Application Priority Data

Nov. 19, 2008 (JP) ................................ 2008-295963

(51) Int. Cl.
*G06F 3/041* (2006.01)
(52) U.S. Cl.
USPC .............. 345/173; 349/12; 349/150; 349/152
(58) Field of Classification Search
USPC .............. 345/173; 361/749; 349/150, 152, 12
See application file for complete search history.

(56) References Cited

U.S. PATENT DOCUMENTS

| 5,069,727 | A | * | 12/1991 | Kouzuma et al. ............. 136/251 |
| 6,055,722 | A | * | 5/2000 | Tighe et al. ..................... 29/843 |
| 7,170,481 | B2 | * | 1/2007 | Doane et al. ..................... 345/87 |
| 2005/0099402 | A1 | | 5/2005 | Nakanishi et al. |

FOREIGN PATENT DOCUMENTS

| JP | 3018780 U | 11/1995 |
| JP | 2005-141643 A | 6/2005 |
| JP | 2005-158008 A | 6/2005 |

OTHER PUBLICATIONS

Official Communication issued in International Patent Application No. PCT/JP2009/002834, mailed on Jul. 28, 2009.

* cited by examiner

*Primary Examiner* — William Boddie
*Assistant Examiner* — Sahlu Okebato
(74) *Attorney, Agent, or Firm* — Keating & Bennett, LLP

(57) ABSTRACT

The gap between a first transparent substrate and a second transparent substrate is greater in a terminal region in which a flexible printed circuit and anisotropic conductive films are inserted, than the gap between the first and second transparent substrates in a detection region. A guide portion which is used to guide an end of the flexible printed circuit at which the anisotropic conductive films are provided, into the gap between the first and second transparent substrates, is provided on the first or second transparent substrate.

8 Claims, 6 Drawing Sheets

TOUCH PANEL AND DISPLAY DEVICE INCLUDING THE SAME

TECHNICAL FIELD

The present invention relates to touch panels and display devices including touch panels.

BACKGROUND ART

In recent years, flat display devices, such as liquid crystal display devices etc., have been widely used in various apparatuses, such as personal computers, mobile telephones, PDAs, game apparatuses, etc. There are also known display devices which detect information about a position on the display screen by using a touch panel (touch screen) provided on the flat display device. For example, Patent Document 1 describes a resistive touch panel.

Resistive touch panels include, for example, a pair of rectangular transparent substrates facing each other with there being a predetermined gap between the substrates. A frame region in which electrodes and interconnects are formed is formed on a peripheral portion of the pair of transparent substrates. A detection region for detecting a touch position is formed on the inner side of the frame region.

A transparent electrode made of indium tin oxide (ITO) etc. is formed on the inner surface of each transparent substrate in the entire detection region. Electrodes are formed in the frame region of one of the transparent substrates, extending along two opposite edges of that transparent substrate. Electrodes are formed in the frame region of the other transparent substrate, extending along two other opposite edges adjacent to the aforementioned two edges.

Terminals formed at one end of interconnects extended from the electrodes are all placed at a single portion in the frame region of the pair of transparent substrates. The region where the terminals are formed is referred to as a terminal region. A flexible printed circuit (FPC) is connected to the terminal region.

In this case, when the transparent electrodes of the pair of transparent substrate contact each other at a touch position, a voltage value sensed between the electrodes of one of the transparent substrates is detected through the transparent electrode of the other transparent substrate. Thus, the touch position is detected.

Incidentally, in the touch panel of Patent Document 1, in order to maintain electrical connection at a thermocompression bonding portion between the terminals and the FPC even in high temperature environments, a projection portion is formed on the transparent substrate, and the FPC is thermocompression bonded to the terminals in the terminal region which is formed in the projection portion.

CITATION LIST

Patent Document

PATENT DOCUMENT 1: Japanese Patent Publication No. 2005-158008

SUMMARY OF THE INVENTION

Technical Problem

Patent Document 1 also describes that the FPC is thermocompression bonded to each terminal with an anisotropic conductive film being interposed therebetween, while the FPC is inserted between the pair of transparent substrates. In this case, the total thickness of the FPC and the anisotropic conductive films is substantially the same as or smaller than the gap distance between the pair of transparent substrates. In other words, the gap distance between the pair of transparent substrates is greater than or equal to the total thickness of the FPC and the anisotropic conductive films.

In recent years, however, there has been a demand for a smaller gap distance between the pair of transparent substrates as the thickness of touch panels or display devices including touch panels has been reduced. Therefore, as shown in a cross-sectional view of FIG. 11, it is contemplated that a gap distance d1 between a pair of transparent substrates 101 and 102 may be caused to be smaller than a total thickness d2 of an FPC 103 and anisotropic conductive films 104. In this case, if one of the pair of transparent substrates 101 and 102 is made of a flexible resin film, the elasticity of the resin film substrate (102 in FIG. 11) allows the FPC 103 and the anisotropic conductive films 104 to be inserted and connected between the pair of transparent substrates 101 and 102 even when the gap distance between the pair of transparent substrates 101 and 102 is narrow.

However, if the gap distance between the pair of transparent substrates 101 and 102 is narrowed in this manner, the thickness of the FPC 103 and the anisotropic conductive films 104 is considerably thin, and therefore, it is extremely difficult to insert the thin FPC 103 etc. into the narrow gap distance d1 between the pair of transparent substrates 101 and 102. As a result, it takes a long time to insert and connect the FPC 103 etc. between the pair of transparent substrates 101 and 102, and therefore, the number of steps increases, disadvantageously resulting in an increase in manufacturing cost. Moreover, because of the difficulty in inserting and connecting the FPC 103 etc., the FPC 103 and the transparent substrates 101 and 102 are likely to be damaged during the insertion and connection process.

The present invention has been made in view of the above problems. It is an object of the present invention to facilitate a process of attaching a flexible printed circuit even while reducing a thickness of a touch panel, thereby reducing manufacturing cost.

Solution to the Problem

To achieve the object, in the present invention a guide portion which is used to guide an end of a flexible printed circuit is provided on a first or second transparent substrate.

Specifically, a touch panel according to the present invention is a resistive touch panel which includes a first transparent substrate, a second transparent substrate facing the first transparent substrate, a frame-shaped frame region formed in a peripheral portion of the first and second transparent substrates, and a detection region formed on an inner side of the frame region and configured to detect a touch position. A terminal region in which a plurality of terminals are arranged together with each other is provided on at least one of the first and second transparent substrates in the frame region. One end of a flexible printed circuit is connected to the terminals in the terminal region via anisotropic conductive films while being inserted between the first and second transparent substrates. A gap between the first and second transparent substrates is greater in the terminal region in which the flexible printed circuit and the anisotropic conductive films are inserted than the gap between the first and second transparent substrates in the detection region. A guide portion configured to guide the one end of the flexible printed circuit at which the anisotropic conductive films are provided, into the gap between the first and second transparent substrates in the terminal region, is provided on the first or second transparent substrate.

The guide portion may be extended from the terminal region of the first or second transparent substrate in a direction parallel to the first or second transparent substrate.

The second transparent substrate may be a flexible resin substrate, and the guide portion may be formed on the second transparent substrate.

The first transparent substrate may be a glass substrate.

The first and second transparent substrates may each be a rectangular substrate, and the first or second transparent substrate on which the guide portion is formed may have a concave notch in an edge thereof on which the guide portion is formed.

A display device according to the present invention includes a display panel, and a touch panel provided on the display panel. The touch panel includes a first transparent substrate, a second transparent substrate facing the first transparent substrate, a frame-shaped frame region formed in a peripheral portion of the first and second transparent substrates, and a detection region formed on an inner side of the frame region and configured to detect a touch position. A terminal region in which a plurality of terminals are arranged together with each other is provided on at least one of the first and second transparent substrates in the frame region. One end of a flexible printed circuit is connected to the terminals in the terminal region via anisotropic conductive films while being inserted between the first and second transparent substrates. A gap between the first and second transparent substrates is greater in the terminal region in which the flexible printed circuit and the anisotropic conductive films are inserted than the gap between the first and second transparent substrates in the detection region. A guide portion configured to guide the one end of the flexible printed circuit at which the anisotropic conductive films are provided, into the gap between the first and second transparent substrates in the terminal region, is provided on the first or second transparent substrate.

The guide portion may be extended from the terminal region of the first or second transparent substrate in a direction parallel to the first or second transparent substrate.

The second transparent substrate may be a flexible resin substrate, and the guide portion may be formed on the second transparent substrate.

The first transparent substrate may be a glass substrate.

The first and second transparent substrates may each be a rectangular substrate, and the first or second transparent substrate on which the guide portion is formed may have a concave notch in an edge thereof on which the guide portion is formed.

—Actions—

Next, actions of the present invention will be described.

The touch panel, when the first or second transparent substrate is touched in the detection region, outputs a detection signal indicating the touch position from the terminals in the terminal region through the anisotropic conductive films to the flexible printed circuit.

Here, when the touch panel is manufactured, the terminal region in which the terminals are arranged together with each other is initially formed on at least one of the first and second transparent substrates. Thereafter, the first and second transparent substrates are aligned to face each other. Next, one end of the flexible printed circuit at which the anisotropic conductive films are provided is inserted into a gap between the first and second transparent substrates.

In this case, the guide portion is provided on the first or second transparent substrate, and therefore, the one end of the flexible printed circuit at which the anisotropic conductive films are provided is guided by the guide portion into the gap between the first and second transparent substrates in the terminal region. Specifically, the one end of the flexible printed circuit is moved on the guide portion while pushing the guide portion, and therefore, the gap between the first and second transparent substrates in the terminal region is widened by the one end of the flexible printed circuit pushing the guide portion.

As a result, even when the gap between the first and second transparent substrates is smaller than the sum of the thickness of the one end of the flexible printed circuit and the thicknesses of the anisotropic conductive films, the one end of the flexible printed circuit and the anisotropic conductive films having a relatively large thickness can be guided by the guide portion to be easily inserted into the relatively small gap between the first and second transparent substrates. Therefore, it is possible to facilitate the process of attaching the flexible printed circuit even while reducing the thicknesses of the touch panel and the display device including the touch panel, thereby reducing manufacturing cost.

Advantages of the Invention

According to the present invention, a guide portion which is used to guide one end of a flexible printed circuit is provided on a first transparent substrate or a second transparent substrate. Therefore, the one end of the flexible printed circuit and anisotropic conductive films having a relatively large thickness can be guided by the guide portion to be easily inserted into a relatively small gap between the first and second transparent substrates. As a result, it is possible to facilitate the process of attaching the flexible printed circuit even while reducing the thicknesses of the touch panel and the display device including the touch panel, thereby significantly reducing manufacturing cost.

DESCRIPTION OF EMBODIMENTS

Embodiments of the present invention will be described hereinafter with reference to the accompanying drawings. Note that the present invention is not limited to the embodiments described below.

First Embodiment of the Invention

FIGS. 1-7 show a first embodiment of the present invention. In this embodiment, a liquid crystal display device 1 including a resistive touch panel 10 will be described as an example display device.

Figure 1:
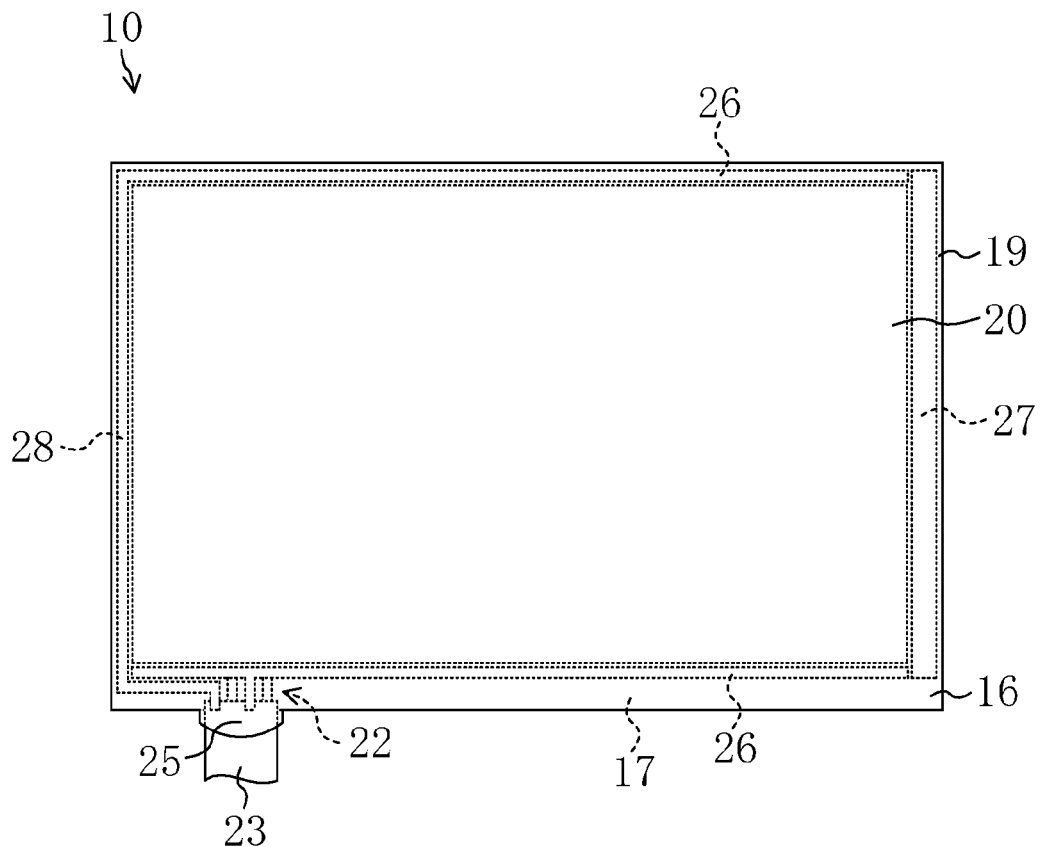
FIG. 1 is a plan view showing an external appearance of a touch panel according to a first embodiment.
Figure 2:
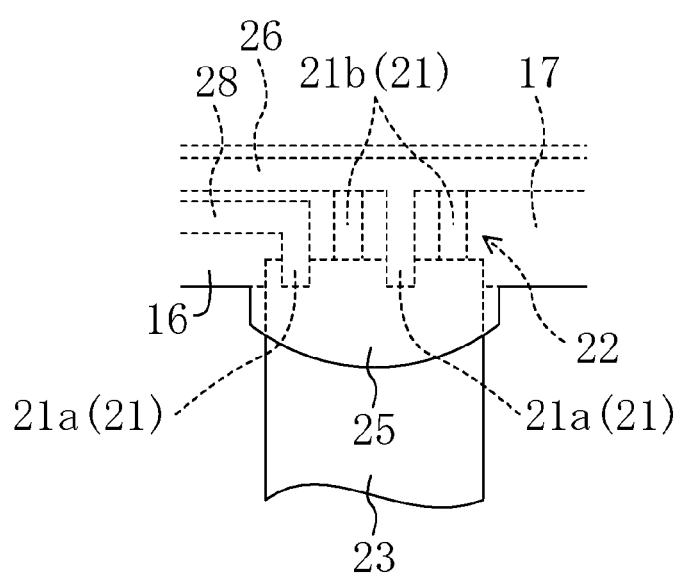
FIG. 2 is an enlarged plan view showing a vicinity of a terminal region in FIG. 1.
Figure 3:
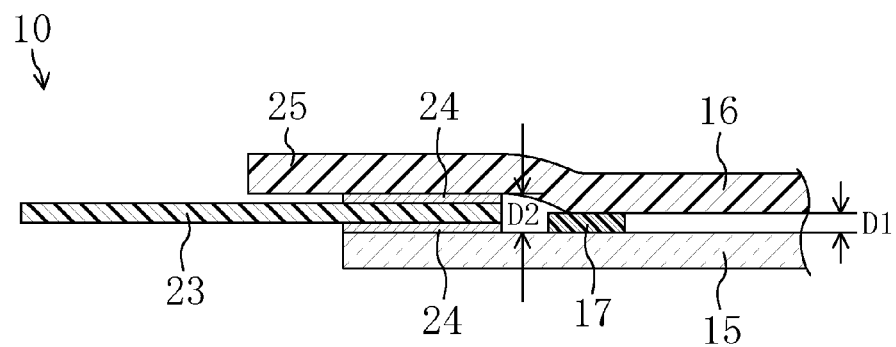
FIG. 3 is an enlarged cross-sectional view showing an FPC and anisotropic conductive films connected to the terminal region.

FIG. 1 is a plan view showing an external appearance of the touch panel of the first embodiment. FIG. 2 is an enlarged plan view showing a vicinity of a terminal region in FIG. 1. FIG. 3 is an enlarged cross-sectional view showing an FPC and anisotropic conductive films connected to the terminal region.

Figure 4:
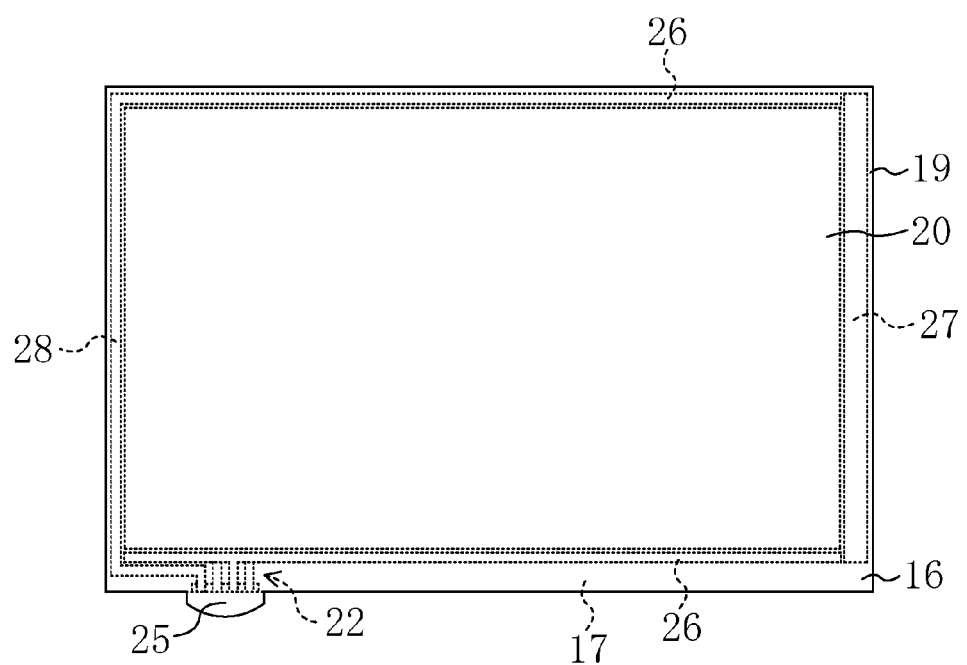
FIG. 4 is a plan view showing a pair of transparent substrates to which the FPC of the first embodiment has not yet been attached.
Figure 5:
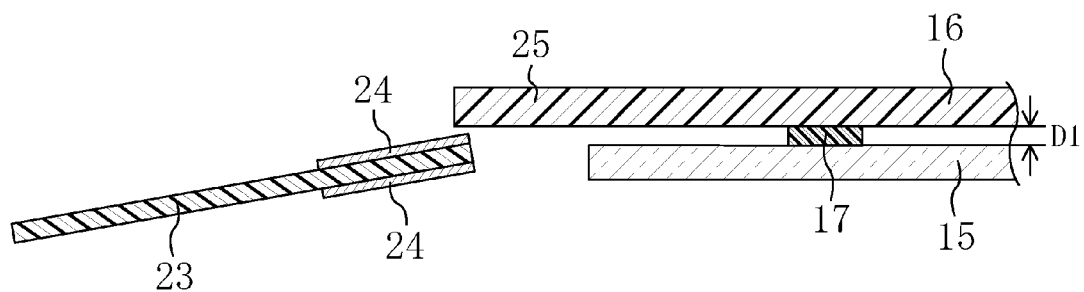
FIG. 5 is an enlarged cross-sectional view showing the FPC which is being inserted into a gap between the pair of transparent substrates.
Figure 6:
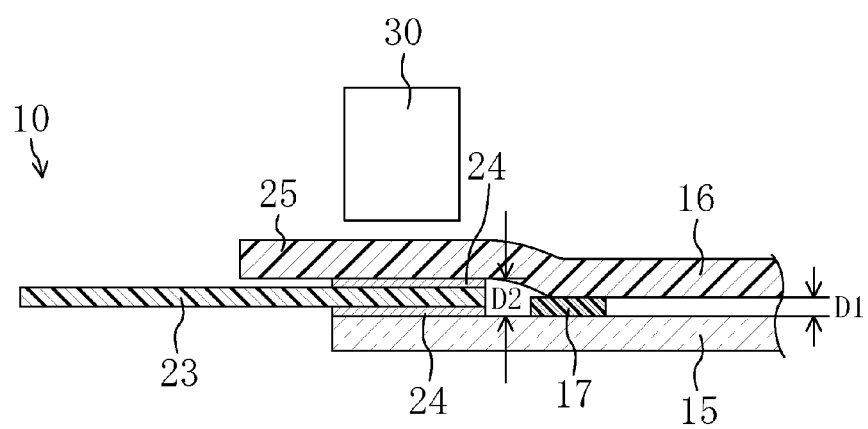
FIG. 6 is an enlarged cross-sectional view showing the FPC which is being thermocompression bonded to the pair of transparent substrates.
Figure 7:
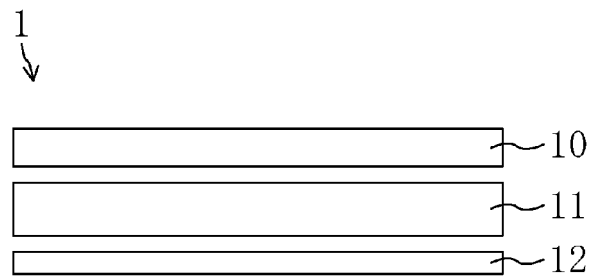
FIG. 7 is a side view schematically showing a configuration of a liquid crystal display device.

FIG. 4 is a plan view showing a pair of transparent substrates to which the FPC of the first embodiment has not yet been attached. FIG. 5 is an enlarged cross-sectional view showing the FPC which is being inserted into a gap between the pair of transparent substrates. FIG. 6 is an enlarged cross-sectional view showing the FPC which is being thermocompression bonded to the pair of transparent substrates. FIG. 7 is a side view schematically showing a configuration of the liquid crystal display device.

The liquid crystal display device 1 includes a liquid crystal display panel 11, a touch panel 10 provided on the liquid crystal display panel 11, and a backlight 12 which is a light source provided on the opposite surface from the touch panel 10 of the liquid crystal display panel 11.

The liquid crystal display panel 11 has a structure (not shown) in which a liquid crystal layer serving as a display medium layer is enclosed between the pair of substrates. The pair of substrates includes a TFT substrate on which a plurality of thin film transistors (TFTs), which are a switching device, a plurality of pixel electrodes, etc. are formed, and a counter substrate on which a common electrode, a color filter, etc. are formed. The TFT substrate and the counter substrate are aligned to face each other.

The liquid crystal display device 1 is a transmissive/reflective liquid crystal display device which reflects ambient external light to serve as a reflective display and also transmits light of the backlight 12 to serve as a transmissive display. Moreover, the liquid crystal display device 1 includes the touch panel 10 and therefore can detect a position touched by the user.

As shown in FIGS. 1 and 3, the touch panel 10, which is of the resistive type, includes a first transparent substrate 15, and a second transparent substrate 16 facing the first transparent substrate 15. The first transparent substrate 15 and the second transparent substrate 16, which constitute a pair of transparent substrates, are each formed in the shape of a rectangle, and have the same size.

As shown in FIG. 1, the touch panel 10 has a frame-shaped frame region 19 which is formed in a peripheral portion of the first transparent substrate 15 and the second transparent substrate 16, and a detection region 20 which is formed on the inner side of the frame region 19 and in which a touch position is detected.

The second transparent substrate 16 is a substrate on which touch operation is performed and is a flexible resin substrate. The resin substrate is made of, for example, a resin, such as polyethylene terephthalate (PET) etc. On the other hand, the first transparent substrate 15 is, for example, a glass substrate.

An adhesive layer 17, such as a double-sided tape etc., which is provided in the frame region 19, is interposed between the first transparent substrate 15 and the second transparent substrate 16. In other words, the first transparent substrate 15 and the second transparent substrate 16 are attached to each other by the adhesive layer 17 with a predetermined gap being provided between the first transparent substrate 15 and the second transparent substrate 16.

A transparent electrode (not shown) made of ITO etc. is uniformly formed on a surface closer to the second transparent substrate 16 of the first transparent substrate 15 in the entire detection region 20. On the other hand, a transparent electrode made of ITO etc. is uniformly formed on a surface closer to the first transparent substrate 15 of the second transparent substrate 16 in the entire detection region 20.

A plurality of spacer dots (not shown) are formed on a surface of the transparent electrode of the first transparent substrate 15. The spacer dot is made of, for example, an epoxy resin etc. having insulation properties, and has a minute dimension smaller than the gap between the substrates 15 and 16 in the detection region 20. The spacer dots are spaced at a predetermined pitch.

As shown in FIG. 1, a terminal region 22 in which a plurality of terminals 21 are arranged together with each other is provided in the frame region 19 of each of the first transparent substrate 15 and the second transparent substrate 16. As shown in the enlarged view of FIG. 2, two terminals 21a, which are spaced apart by a predetermined distance, are provided on the surface closer to the second transparent substrate 16 of the first transparent substrate 15 in the terminal region 22. On the other hand, two terminals 21b, which are spaced apart by a predetermined distance, are provided on the surface closer to the first transparent substrate 15 of the second transparent substrate 16 in the terminal region 22. As shown in FIG. 2, the terminals 21a and 21b are alternately spaced at predetermined intervals, as viewed in a direction normal to the substrates.

A pair of electrodes 26 is formed on the surface closer to the second transparent substrate 16 of the first transparent substrate 15 in the frame region 19. The electrodes 26 of the pair are formed on two respective opposite edges of the first transparent substrate 15, extending along the edges.

An interconnect 28 is formed on an edge (the left-hand edge in FIG. 1) which links one end of each of the two opposite edges. One end of the interconnect 28 is connected to one end of the electrode 26 formed on one (the upper edge of FIG. 1) of the two opposite edges, and the other end of the interconnect 28 is connected to one of the terminals 21a in the terminal region 22 formed on the other (the lower edge of FIG. 1) of the two opposite edges.

On the other hand, the electrode 26 formed on the other (the lower edge of FIG. 1) of the two opposite edges is connected to the other terminal 21a in the terminal region 22 formed on that other edge.

On the other hand, a pair of electrodes 27 is formed on the surface closer to the first transparent substrate 15 of the second transparent substrate 16 in the frame region 19. The electrodes 27 of the pair are provided on two respective edges different from those on which the electrodes 26 are provided, as viewed from the direction normal to the substrate. Note that one of the electrodes 27 is provided on the left-hand edge of FIG. 1, overlying a back surface of the interconnect 28 of the first transparent substrate 15.

The electrodes 27 are also connected to the respective terminals 21b in the terminal region 22 of the second transparent substrate 16 via interconnects (not shown) formed in the frame region 19 of the second transparent substrate 16. The electrodes 26 and 27, the interconnect 28, and the terminals 21 are each made of, for example, a cured conductive paste film in which silver powder is dispersed.

As shown in FIGS. 1-3, one end of a flexible printed circuit (hereinafter referred to as an FPC) 23 is connected to the terminals 21a and 21b in the terminal region 22 via anisotropic conductive films 24, while being inserted between the first transparent substrate 15 and the second transparent substrate 16. The other end of the FPC 23 is connected to an external circuit (not shown).

Specifically, on each of opposite surfaces of the FPC 23 at one end thereof, terminals (not shown) are formed, and the anisotropic conductive films (anisotropic conductive paste (ACP)) 24 are provided to cover the terminals. The terminals on the surface closer to the second transparent substrate 16 of the FPC 23 at the one end thereof are electrically connected via the corresponding anisotropic conductive film 24 to the terminals 21a of the terminal region 22, while the terminals on the surface closer to the first transparent substrate 15 of the FPC 23 at the one end thereof are electrically connected via the corresponding anisotropic conductive film 24 to the terminals 21b of the terminal region 22.

On the second transparent substrate 16, provided is a guide portion 25 which guides the one end of the FPC 23 on which the anisotropic conductive films 24 are provided, into the gap between the first transparent substrate 15 and the second transparent substrate 16 in the terminal region 22.

The guide portion 25 is formed to extend from the terminal region 22 of the second transparent substrate 16 in a direction parallel to the first transparent substrate 15. In other words, the guide portion 25 is integrally formed with the second transparent substrate 16. The extended portion of the guide portion 25 has an arc-shaped tip portion. The guide portion 25 has a width slightly greater than that of the FPC 23. Note that the width of the guide portion 25 may be smaller than that of the FPC 23.

The gap distance between the first transparent substrate 15 and the second transparent substrate 16 is greater in the terminal region 22 in which the FPC 23 and the anisotropic conductive films 24 are inserted, than the gap distance between the first transparent substrate 15 and the second transparent substrate 16 in the detection region 20. Specifically, a gap distance D2 between the first transparent substrate 15 and the second transparent substrate 16 in the terminal region 22 (i.e., the total thickness of the FPC 23 and the anisotropic conductive films 24) is greater than a gap distance D1 between the first transparent substrate 15 and the second transparent substrate 16 in the detection region 20.

This is because the FPC 23 and the anisotropic conductive films 24 are inserted between the first transparent substrate 15 and the second transparent substrate 16 in the terminal region 22, whereby the gap between the first transparent substrate 15 and the second transparent substrate 16 is widened by the FPC 23 etc., so that the second transparent substrate 16 is deformed due to the flexibility thereof.

Next, operation of the touch panel 10 will be described.

A predetermined voltage is applied to the pair of electrodes 27 of the second transparent substrate 16. As a result, a potential gradient is formed in a horizontal direction of FIG. 1 in the transparent electrode of the second transparent substrate 16, due to the resistance of the ITO. In this case, when the detection region 20 of the second transparent substrate 16 is touched to be warped toward the first transparent substrate 15, the transparent electrode of the second transparent substrate 16 contacts the transparent electrode of the first transparent substrate 15. In this case, the potential of the contact point is detected through the transparent electrode of the first transparent substrate 15. A detection signal is output from the terminals 21 of the terminal region 22 through the FPC 23 to an external circuit. Thus, a touch position is detected.

Next, processes of manufacturing the touch panel 10 and the liquid crystal display device 1 will be described.

The liquid crystal display device 1 is manufactured as follows. Initially, a pair of substrates, i.e., a TFT substrate and a counter substrate, are separately formed. The TFT substrate and the counter substrate are each manufactured by performing photolithography on a transparent substrate, such as a glass substrate etc., to form desired elements, electrodes, etc.

Next, the TFT substrate and the counter substrate are attached to each other, and a liquid crystal layer is enclosed between the TFT substrate and the counter substrate. Thus, the liquid crystal display panel 11 is manufactured.

Next, a backlight manufactured separately is provided on a back surface of the liquid crystal display panel 11, while the touch panel 10 is provided on a front surface of the liquid crystal display panel 11. Thus, the liquid crystal display device 1 is manufactured.

Here, a process of manufacturing the touch panel 10 will be described.

Initially, the first transparent substrate 15 and the second transparent substrate 16 are separately formed. The first transparent substrate 15 is formed by uniformly forming an ITO film on a surface of, for example, a glass substrate in an entire region thereof which is to serve as the detection region 20. The ITO film may be formed by, for example, sputtering etc. Thereafter, a plurality of spacer dots made of an epoxy resin etc. are formed on a surface of the ITO film by screen printing etc. Also, the electrodes 26, the interconnect 28, and the terminal region 22 made of, for example, a cured conductive paste film in which silver powder is dispersed are simultaneously and integrally formed in a region which is to serve as the frame region 19, by screen printing etc. Thus, the first transparent substrate 15 is formed.

On the other hand, the second transparent substrate 16 is formed by uniformly forming an ITO film on a surface of a resin substrate made of PET etc in an entire region thereof which is to serve as the detection region 20. The ITO film is formed by, for example, sputtering etc. as in the case of the first transparent substrate 15. Also, the electrodes 27, an interconnect (not shown), and the terminal region 22 made of, for example, a cured conductive paste film in which silver powder is dispersed are simultaneously and integrally formed in a region which is to serve as the frame region 19, by screen printing etc. as in the case of the first transparent substrate 15. Thus, the second transparent substrate 16 is formed.

Thereafter, a double-sided tape serving as the adhesive layer 17 is attached to the first transparent substrate 15 or the second transparent substrate 16 in the frame region 19. Thereafter, the first transparent substrate 15 and the second transparent substrate 16 are aligned to face each other, and then attached to each other with the adhesive layer 17 being interposed therebetween. In this case, the gap distance between the first transparent substrate 15 and the second transparent substrate 16 is D1, i.e., the same, in the detection region 20 and the frame region 19.

On the other hand, the anisotropic conductive film (ACP) 24 is provided on each of the opposite surfaces of the FPC 23 at one end thereof Next, the one end of the FPC 23 at which the anisotropic conductive films 24 are provided is inserted into the gap between the first transparent substrate 15 and the second transparent substrate 16 in the terminal region 22.

In this case, as shown in FIG. 5, the guide portion 25 is provided in the terminal region 22 of the second transparent substrate 16, and therefore, the one end of the FPC 23 which approaches the vicinity of the terminal region 22 is guided by the guide portion 25 to be inserted into the gap between the first transparent substrate 15 and the second transparent substrate 16 in the terminal region 22.

Specifically, the one end of the FPC 23 is moved on the guide portion 25 while pushing the guide portion 25, and therefore, the gap between the first transparent substrate 15 and the second transparent substrate 16 in the terminal region 22 is widened by the one end of the FPC 23 pushing the guide portion 25 and the second transparent substrate 16, which are flexible. As a result, the one end of the FPC 23 at which the anisotropic conductive films 24 are provided is easily inserted into the gap between the first transparent substrate 15 and the second transparent substrate 16.

Thereafter, as shown in FIG. 6, the terminal region 22 and the one end of the FPC 23 are thermocompression bonded together using a constant heater 30. By the above process, the touch panel 10 is manufactured.

Advantages of First Embodiment

Therefore, according to the first embodiment, the guide portion 25 is provided on the second transparent substrate 16. Therefore, even if the gap distance D1 between the first transparent substrate 15 and the second transparent substrate 16 is smaller than the sum D2 of the thickness of the one end of the FPC 23 and the thicknesses of the anisotropic conductive films 24, the one end of the FPC 23 and the anisotropic conductive films 24 which have a relatively large thickness can be guided by the guide portion 25 to be easily inserted into the relatively small gap between the first transparent substrate 15 and the second transparent substrate 16. As a result, while the thicknesses of the touch panel 10 and the liquid crystal display device 1 including the touch panel 10 are reduced, the process of attaching the FPC 23 can be facilitated to significantly reduce manufacturing cost.

Moreover, by providing the guide portion 25, the insertion and connection process of the FPC 23 is facilitated. Therefore, damage to the FPC 23 and the first transparent substrate 15 and the second transparent substrate 16 can be reduced or prevented to improve the yield. In addition, the reliability of connection between the FPC 23 and the terminal region 22 can be enhanced.

Moreover, the extended portion of the guide portion 25 has the arc-shaped tip portion. Therefore, the insertion and connection process of the FPC 23 can be safely performed, and in addition, even if the FPC 23 contacts the guide portion 25, the damage can be reduced or prevented. Moreover, the facilitated insertion and connection process of the FPC 23 may be automated using a robot etc.

Second Embodiment of the Invention

Figure 8:
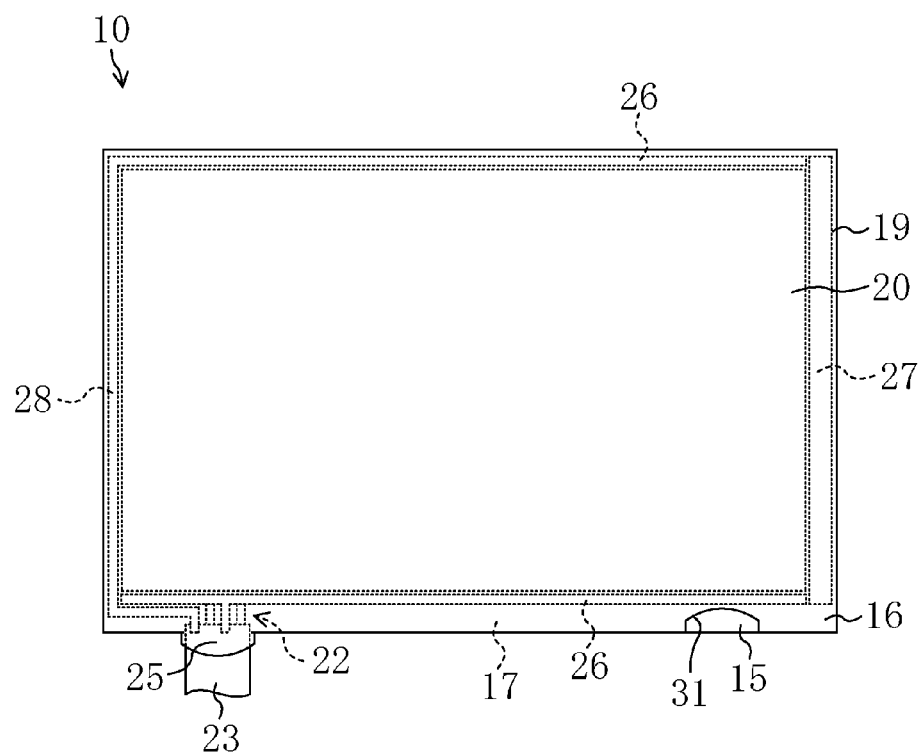
FIG. 8 is a plan view showing an external appearance of a touch panel according to a second embodiment.
Figure 9:
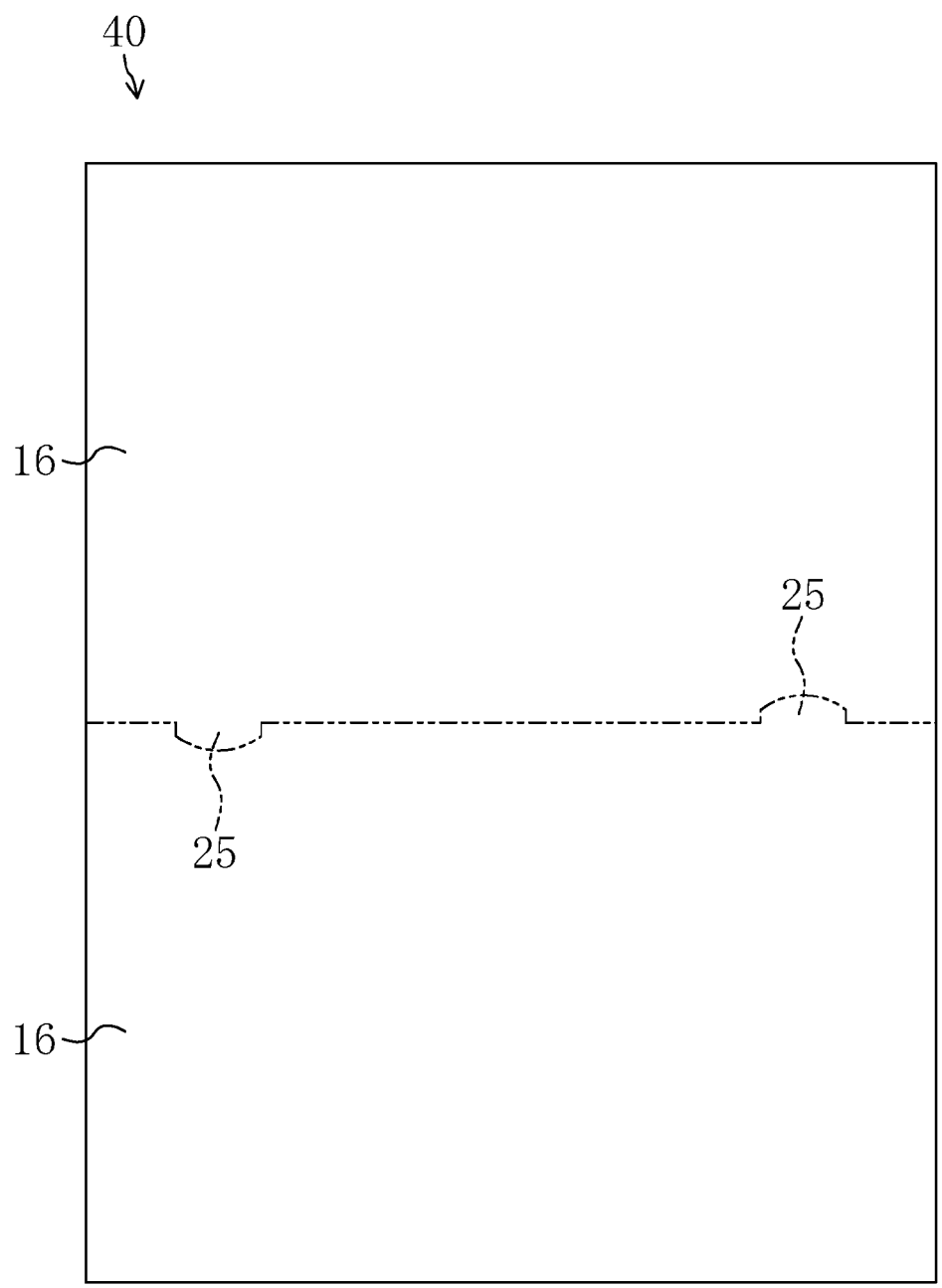
FIG. 9 is a plan view showing a substrate base material for second transparent substrates which has not yet been cleaved.

FIGS. 8 and 9 show a second embodiment of the present invention.

FIG. 8 is a plan view showing an external appearance of a touch panel according to the second embodiment. FIG. 9 is a plan view showing a substrate base material for second transparent substrates which has not yet been cleaved. Note that, in the embodiments below, the same portions as those of FIGS. 1-7 are indicated by the same reference characters, and a detailed description thereof will be omitted.

The touch panel 10 of the second embodiment is similar to that of the first embodiment, except that a notch 31 is formed in the second transparent substrate 16.

Specifically, as shown in FIG. 8, the concave notch 31 is formed in an edge on which the guide portion 25 is formed, of the frame region 19 of the second transparent substrate 16. The concave shape of the notch 31 matches the convex shape of the guide portion 25. The distance between a middle position of a region where the notch 31 is formed, and a right-hand end of the second transparent substrate 16, is the same as the distance between a middle position of a region where the guide portion 25 is formed, and a left-hand end of the second transparent substrate 16. In other words, the notch 31 and the guide portion 25 are located at positions axisymmetric with respect to the bisector of the edge of the second transparent substrate 16 on which the guide portion 25 is formed.

A depth of the notch 31 and a length (protrusion length) of the extended portion of the guide portion 25 are each smaller than a width of the frame region 19 (a width from an end closer to the detection region 20 of the frame region 19 to an end of the second transparent substrate 16). Because the notch 31 is formed within the frame region 19, the notch 31 does not interfere with the detection of a touch position.

When the second transparent substrate 16 is cut out from a large-size substrate base material 40 during manufacture of the touch panel 10 of the second embodiment, the guide portions 25 and the notches 31 of two second transparent substrates 16 can be simultaneously formed by performing a cleavage process once as shown in FIG. 9.

According to the second embodiment, the guide portion 25 is provided on the second transparent substrate 16, and therefore, advantages similar to those of the first embodiment can be obtained. In addition, the number of the second transparent substrates 16 cut out from the substrate base material 40 can be increased, whereby the substrate base material 40 can be efficiently used to reduce manufacturing cost.

Third Embodiment of the Invention

Figure 10:
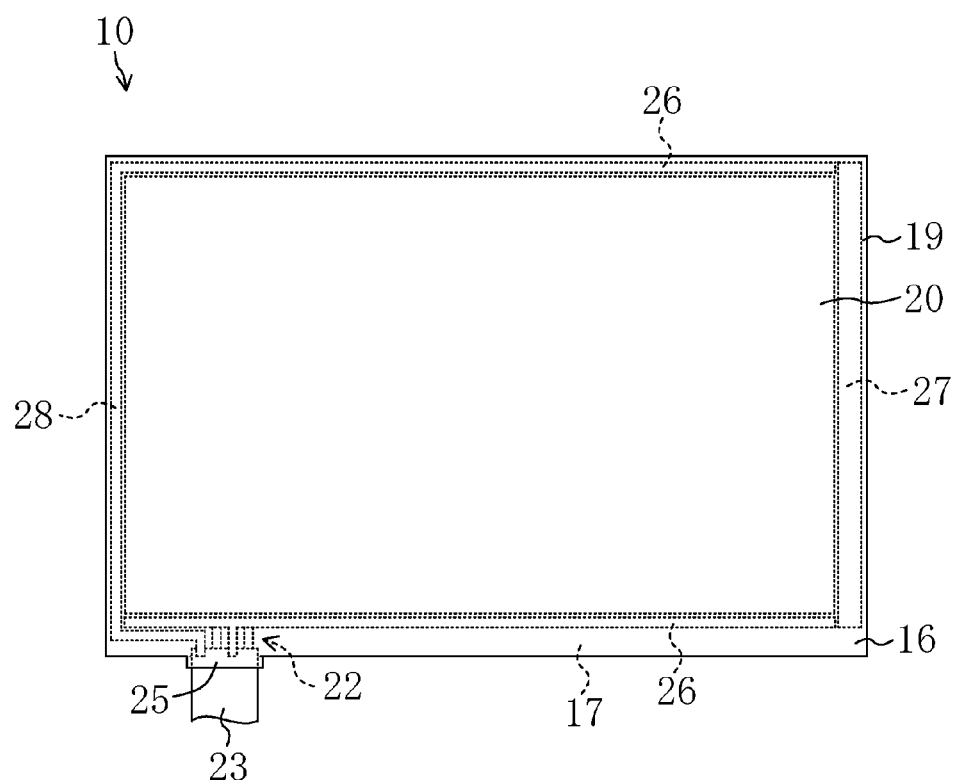
FIG. 10 is a plan view showing an external appearance of a touch panel according to a third embodiment.
Figure 11:
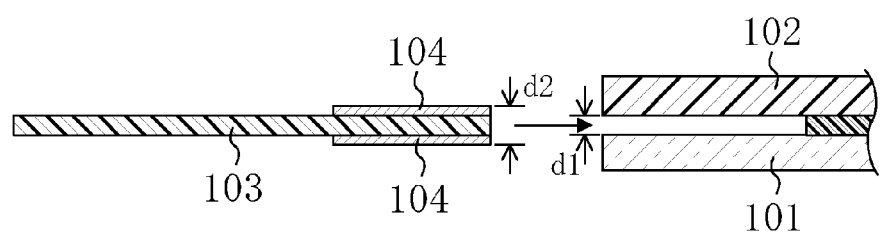
FIG. 11 is an enlarged cross-sectional view of an FPC etc. which are being inserted into a conventional pair of transparent substrates.

FIG. 10 shows a third embodiment of the present invention.
FIG. 10 is a plan view showing an external appearance of a touch panel according to the third embodiment.

While, in the first embodiment, the extended portion of the guide portion 25 has the arc-shaped tip portion, in the third embodiment the extended portion of the guide portion 25 has a linear tip portion. Specifically, the guide portion 25 of the third embodiment is formed in the shape of a rectangle. Even in this case, advantages similar to those of the first embodiment can be obtained.

Also, as in the second embodiment, a notch having the same rectangular shape as that of the guide portion 25 may be formed in the second transparent substrate 16 having the guide portion 25 of the third embodiment. As a result, manufacturing cost can be reduced.

Other Embodiments

While, in each of the above embodiments, the example in which the first transparent substrate 15 is a glass substrate has been described, the first transparent substrate 15 may be other substrates, such as a transparent resin substrate (PET etc.) etc.

While, in each of the above embodiments, the example in which the guide portion 25 is integrally formed with the second transparent substrate 16 has been described, the present invention is not limited to this. A guide portion which guides, for example, one end of the FPC 23 may be provided separately and independently of the first transparent substrate 15 and the second transparent substrate 16.

While, in each of the above embodiments, the example in which the terminal region 22 is provided both on the first transparent substrate 15 and the second transparent substrate 16 in the frame region 19 has been described, the present invention is not limited to this. The terminal region 22 may be provided on at least one of the first transparent substrate 15 and the second transparent substrate 16 in the frame region 19.

For example, an electrode may be formed on each of four edges of the frame region 19 of the first transparent substrate 15, and no electrode may be formed in the frame region 19 of the second transparent substrate 16. In this case, the terminal region 22 may be formed only on the first transparent substrate, the guide portion 25 may be formed on the second transparent substrate 16, and an FPC etc. may be inserted and connected between the first transparent substrate 15 and the second transparent substrate 16. Also in this case, advantages similar to those of the above embodiments can be obtained.

While, in each of the above embodiments, the example in which the guide portion 25 is provided on the second transparent substrate 16 has been described, the guide portion 25 may be provided on the first transparent substrate 15 when the first transparent substrate 15 is a flexible resin substrate. In other words, the guide portion 25 can be provided on either the first transparent substrate 15 or the second transparent substrate 16. When the guide portion 25 is provided on the first transparent substrate 15, the guide portion 25 is preferably extended from the terminal region 22 of the first transparent substrate 15 in a direction parallel to the second transparent substrate 16. Moreover, the concave notch 31 may be formed in an edge of the first transparent substrate 15 on which the guide portion 25 is formed.

While, in each of the above embodiments, the liquid crystal display device 1 has been described as an example, the present invention is similarly applicable to other display devices, such as an organic EL display device whose display panel is an organic EL display panel, etc.

INDUSTRIAL APPLICABILITY

As described above, the present invention is useful for touch panels and display devices including touch panels.

DESCRIPTION OF REFERENCE CHARACTERS

1 Liquid Crystal Display Device
10 Touch Panel
11 Liquid Crystal Display Panel
12 Backlight
15 First Transparent Substrate
16 Second Transparent Substrate
19 Frame Region
20 Detection Region
21, 21A, 21B Terminal
22 Terminal Region
23 FPC
24 Anisotropic Conductive Film
25 Guide Portion
31 Notch

The invention claimed is:
1. A resistive touch panel comprising:
a first transparent substrate;
a second transparent substrate facing the first transparent substrate;
a frame-shaped frame region arranged in a peripheral portion of the first and second transparent substrates; and
a detection region arranged on an inner side of the frame region and configured to detect a touch position,
wherein
a terminal region in which a plurality of terminals are arranged together with each other is provided on at least one of the first and second transparent substrates in the frame region,
one end of a flexible printed circuit is connected to the terminals in the terminal region via anisotropic conductive films while being inserted between the first and second transparent substrates,
a gap between the first and second transparent substrates is greater in the terminal region in which the flexible printed circuit and the anisotropic conductive films are inserted than the gap between the first and second transparent substrates in the detection region,
a guide portion configured to guide the one end of the flexible printed circuit at which the anisotropic conductive films are provided, into the gap between the first and second transparent substrates in the terminal region, is provided on the first or second transparent substrate,
the flexible printed circuit is thermocompression bonded to both of the first transparent substrate and the second transparent substrate through respective ones of the anisotropic conductive films,
the guide portion is extended from the terminal region of the first or second transparent substrate in a direction parallel to the first or second transparent substrate,
the first and second transparent substrates are each a rectangular substrate,
the first or second transparent substrate on which the guide portion is formed has a concave notch in an edge thereof on which the guide portion is formed, and
an edge of the guide portion and an edge of the notch are symmetric about a center of a side in which the guide portion is arranged.
2. The touch panel of claim 1, wherein
the second transparent substrate is a flexible resin substrate, and
the guide portion is formed on the second transparent substrate.
3. The touch panel of claim 2, wherein
the first transparent substrate is a glass substrate.
4. A display device comprising:
a display panel; and
a touch panel provided on the display panel,
wherein
the touch panel includes a first transparent substrate, a second transparent substrate facing the first transparent substrate, a frame-shaped frame region arranged in a peripheral portion of the first and second transparent substrates, and a detection region arranged on an inner side of the frame region and configured to detect a touch position,
a terminal region in which a plurality of terminals are arranged together with each other is provided on at least one of the first and second transparent substrates in the frame region,
one end of a flexible printed circuit is connected to the terminals in the terminal region via anisotropic conductive films while being inserted between the first and second transparent substrates,
a gap between the first and second transparent substrates is greater in the terminal region in which the flexible printed circuit and the anisotropic conductive films are inserted than the gap between the first and second transparent substrates in the detection region, a guide portion configured to guide the one end of the flexible printed circuit at which the anisotropic conductive films are provided, into the gap between the first and second transparent substrates in the terminal region, is provided on the first or second transparent substrate, and the flexible printed circuit is thermocompression bonded to both of the first transparent substrate and the second transparent substrate through respective ones of the anisotropic conductive films, the guide portion is extended from the terminal region of the first or second transparent substrate in a direction parallel to the first or second transparent substrate, the first and second transparent substrates are each a rectangular substrate, the first or second transparent substrate on which the guide portion is formed has a concave notch in an edge thereof on which the guide portion is formed, and an edge of the guide portion and an edge of the notch are symmetric about a center of a side in which the guide portion is arranged.

5. The display device of claim 4, wherein
the second transparent substrate is a flexible resin substrate, and
the guide portion is formed on the second transparent substrate.

6. The display device of claim 5, wherein
the first transparent substrate is a glass substrate.

7. The touch panel of claim 1, wherein
the second transparent substrate is a flexible resin substrate, and
the guide portion is formed on the second transparent substrate.

8. The display device of claim 4, wherein
the second transparent substrate is a flexible resin substrate, and
the guide portion is formed on the second transparent substrate.

* * * * *